United States Patent [19]

Einthoven et al.

[11] 3,751,726

[45] Aug. 7, 1973

[54] SEMICONDUCTOR DEVICE EMPLOYING DARLINGTON CIRCUIT

[75] Inventors: Willem Gerard Einthoven, Belle Mead; Carl Franklin Wheatley, Jr., Somerset, both of N.J.

[73] Assignee: RCA Corporation, New York, N.Y.

[22] Filed: Nov. 18, 1971

[21] Appl. No.: 199,880

[52] U.S. Cl. ......... 317/235 R, 307/315, 317/234 N, 317/235 D, 317/235 Z, 317/235 AE, 317/235 AK

[51] Int. Cl. .......... H01l 19/00

[58] Field of Search ................ 307/315; 317/235 D, 317/238 AK, 235 AE, 235 Z

[56] References Cited

UNITED STATES PATENTS

| | | | |
|---|---|---|---|
| 3,210,617 | 10/1965 | Kruper | 317/234 R |
| 3,596,150 | 7/1971 | Berthold et al. | 317/235 D |
| 2,985,804 | 5/1961 | Buie | 317/235 D |
| 3,624,454 | 11/1971 | Adkinson | 317/235 D |

*Primary Examiner*—John W. Huckert
*Assistant Examiner*—William D. Larkins
*Attorney*—G. H. Bruestle, H. Christoffersen, R. Williams and M. Epstein

[57] ABSTRACT

A device employs two emitters in a common base region having a base-collector junction which only intersects a mesa edge of the device. A distributed resistance is defined between a base contact and a conductive layer substantially uniformly overlapping the outer periphery of one of the emitters which completely surrounds the base contact.

9 Claims, 4 Drawing Figures

SEMICONDUCTOR DEVICE EMPLOYING DARLINGTON CIRCUIT

BACKGROUND OF THE INVENTION

The present invention relates to semiconductor devices, and in particular, relates to semiconductor devices which are designed to integrally perform two or more functions.

A well known three-terminal amplifier circuit, commonly referred to as the "Darlington" circuit, employs two transistors, one of which is a driving transistor for the second, a power transistor. Functionally, the collectors of both transistors are electrically connected together and the emitter of the driving transistor is electrically connected to the base of the power transistor. It is advantageous to employ a resistor between the base and emitter of each transistor. It is also suitable to employ a diode between the emitter and collector of the power transistor, to provide a low impedance path in the event of reverse-current flow. The utility of the Darlington circuit lies in the realization of a beta (gain figure) for the circuit which is approximately equal to the product of the beta of both transistors.

There have been many attempts to integrate the Darlington circuit in a single semiconductor device. See, for example, U. S. Pat. Nos. 3,263,178 to Norwalk, U.S. Pat. No. 3,316,466 to Husa et al., U.S. Pat. No. 3,544,860 to Lichowsky and U.S. Pat. No. 3,569,150 to Berthold et al.; and see the following publications: "Semiconductor News Briefs", page 4, volume 4, No. 1, 1970; and "Electronics" magazine, page 116, Apr. 5, 1965. However, integrated Darlington devices have heretofore had several drawbacks. The earliest devices defined only the two transistor functions, and were not capable of adequately achieving the resistor and diode functions described above. Later devices achieved these additional functions, but at the expense of the power capability of the power transistor. More specifically, these later devices utilized portions of the collector region extending to the upper (emitter) surface, in order to isolate portions of the base region and introduce the desired resistor function in the driving device. However, this type of planar structure prevents the use of a base-collector junction which only intersects the edge of the device, and thus limits the breakdown capability of the power transistor. Further, the resistors in the prior art structures have been concentrated in small areas, which results in uneven thermal distributions within the device.

THE DRAWING

DETAILED DESCRIPTION

Figure 1:
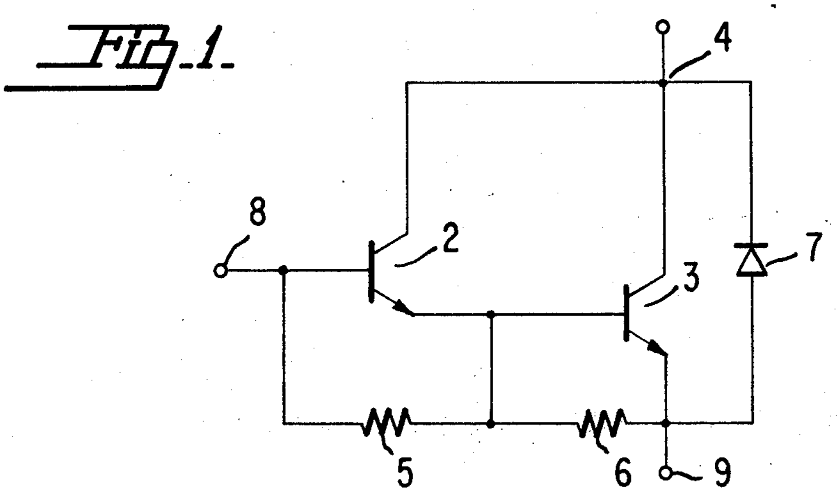
FIG. 1 is a schematic diagram of a Darlington circuit.

A schematic diagram of a Darlington circuit is shown in FIG. 1. The circuit includes a driving transistor 2 and a power transistor 3 with the emitter of the driver electrically connected to the base of the power transistor. While the transistors 2 and 3 are shown as NPN devices, the circuit may also employ PNP transistors. The collector of each transistor 2,3 is connected to a potential point 4 which is common to both. A first resistor 5 is connected between the base and emitter of the driving transistor 2, and a second resistor 6 is connected between the base and emitter of the power transistor 3. A diode 7 is connected between the emitter and collector of the power transistor 3. The three terminal Darlington circuit function is thus defined between the common collector point 4, a base connection 8 to the driving transistor 2, and an emitter connection 9 to the power transistor 3.

Shown in FIGS. 2–4 and described with reference thereto is a semiconductor device which integrally defines all of the functions of the circuit in FIG. 1.

The device, generally referred to as 10, is formed in a semiconductor body 12 (as silicon) having upper and lower opposed surfaces 14 and 16, respectively, and an edge surface 17. An NPN device is shown (in FIGS. 3 and 4) for illustrative purposes only.

Figure 2:
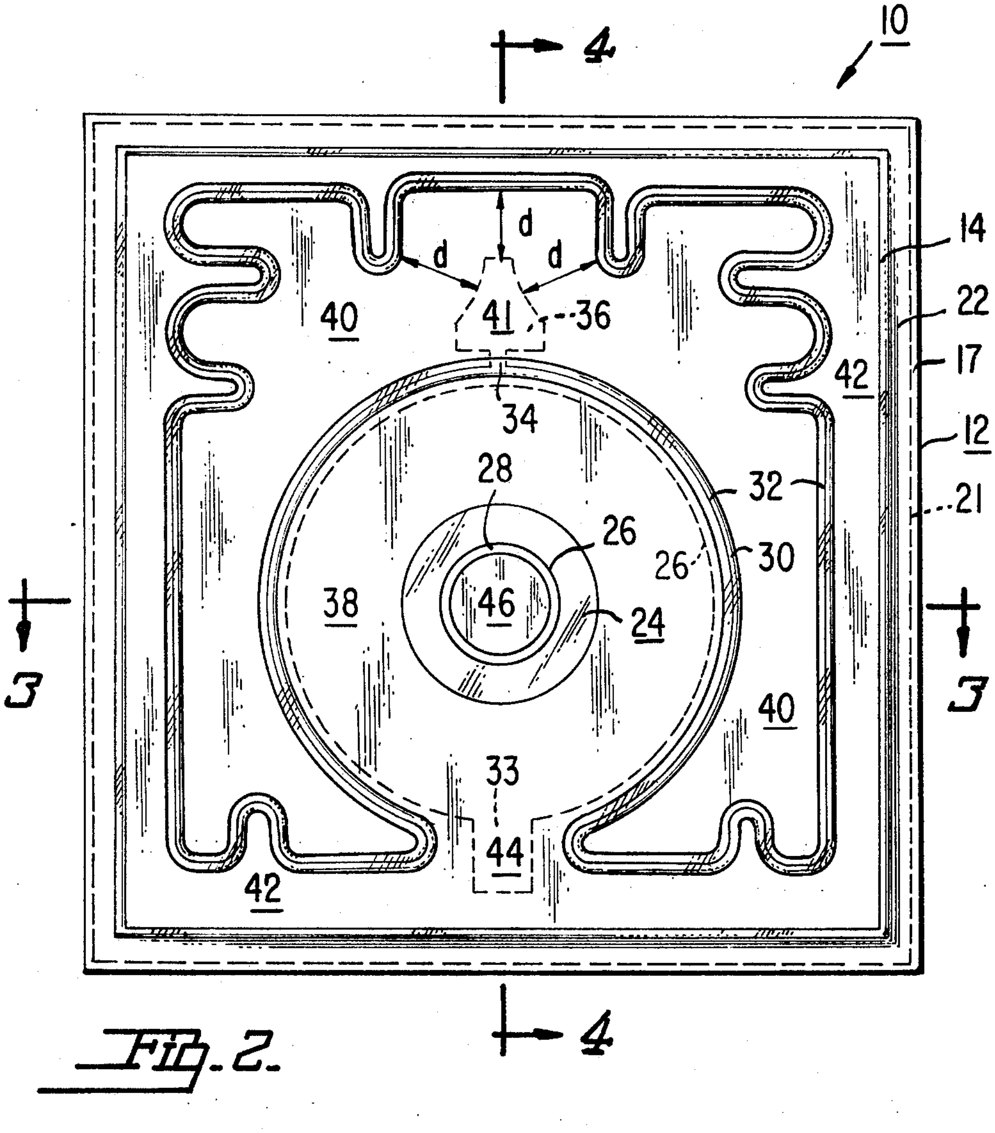
FIG. 2 is a top plan view of a semiconductor device which embodies the circuit of FIG. 1.
Figure 3:
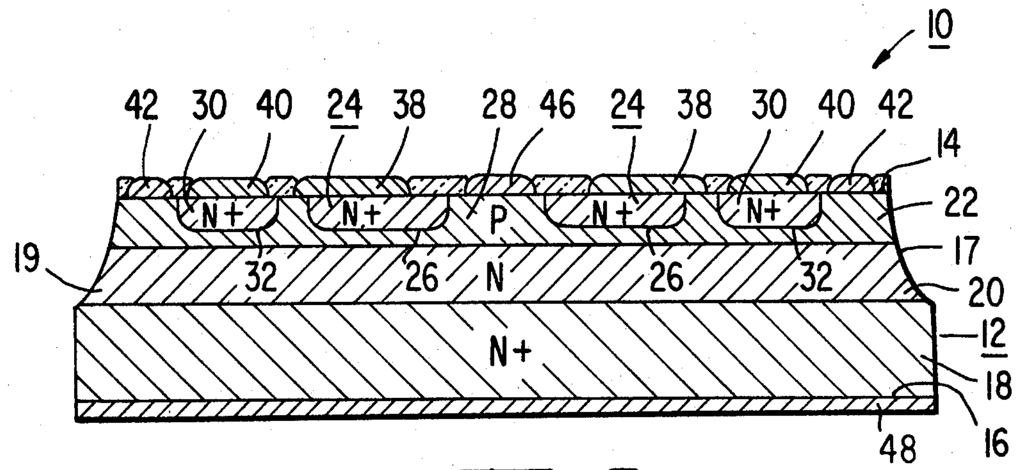
FIG. 3 is a cross-section of FIG. 2 taken along the line 3–3'.
Figure 4:
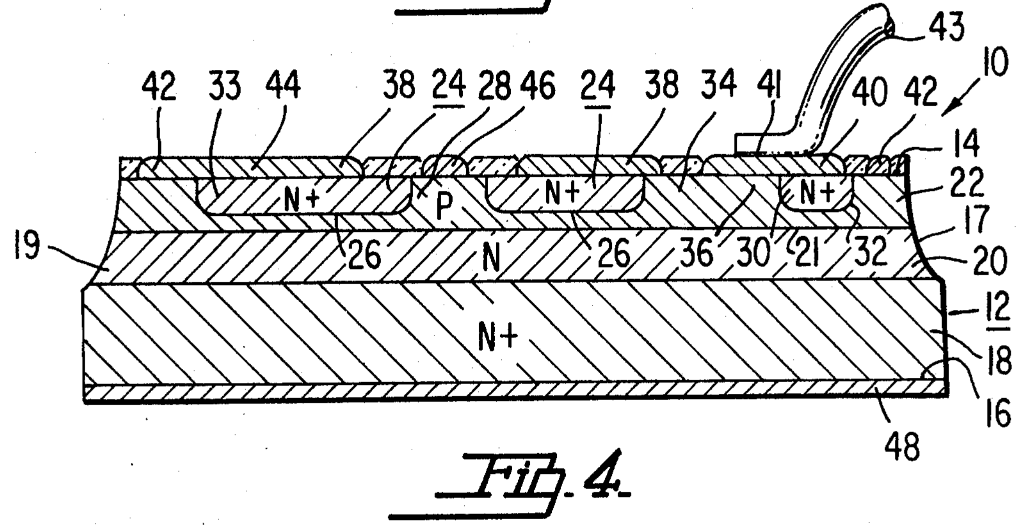
FIG. 4 is a cross-section of FIG. 2 taken along the line 4–4'.

Noting FIGS. 3 and 4, the device 10 includes a highly conductive substrate 18 of one type conductivity in the body 12 adjacent the lower surface 16, and a collector region 20 of the one type conductivity adjacent the substrate 18. This one type conductivity is N type in the embodiment of FIGS. 2–4. The device 10 further includes a base region 22 of a type conductivity which is opposite to the one type conductivity (P type in FIGS. 3 and 4). The base region 22 is disposed in the body 12 between the upper surface 14 and the collector region 20. The base and collector regions 22 and 20 are separated by a base-collector PN junction 21 which extends across the entire device 10 and only intersects the edge surface 17. The edge surface 17 is preferably beveled to provide a mesa 19 which includes the base and collector regions 20 and 22.

The device 10 further includes two emitter regions of the one conductivity type. A first one of the emitter regions 24 extends into the base region 22 and forms a first emitter-base PN junction 26 therewith. The first emitter region 24 completely surrounds a centrally located portion 28 of the base region 22 which extends to the upper surface 14. It is particularly suitable to employ an annular or ring-shaped first emitter region 24, as shown in FIG. 2, in which the inner periphery of the first emitter-base junction 26 is equidistant from the middle of the centrally located base region portion 28. Preferably, the first emitter region 24 includes a small tab 33 (FIG. 2) which extends outwardly from the outer periphery of the first emitter region.

The second emitter region 30 extends into the base region 22 from the upper surface 14 and forms a second emitter-base PN junction 32 therebetween. The second emitter region 30 is spaced from, and uniformly surrounds, a substantial portion of the outer periphery of the first emitter region 24. Preferably, the second emitter region 30 surrounds all of the outer periphery of the first emitter region 24, except where an extension 44 is made from a first conductive layer 38, which is described below. In order to increase the power handling capability of the power transistor, the outer periphery of the second emitter-base junction 32 is preferably "scalloped" at appropriate locations to provide emitter fingers (not numbered) which are interdigitated with corresponding fingers of the base region 22.

The device 10 further includes a channel region 34 integral with and of the same type conductivity as the base region 22. The channel region 34 extends into the second emitter region 30 from the inner periphery thereof. The dimensions of the channel region 34 are not critical; for example, the channel region 34 may be as small as 1.0 mils wide and 2.0 mils long. The precise location of the channel region 34 on the inner periphery of the second emitter region 30 is also not critical; suitably, it is disposed adjacent a subregion 36, which is described next.

A subregion 36 of the opposite conductivity type extends into the second emitter region 30 integral with the base channel 22, and preferably is integral with the channel region 34. The dimensions of the subregion 36 are also not critical; for example, a subregion having 100 square mils of surface area is satisfactory. However, it is particularly suitable that the portion of the edge of the subregion 36 which is adjacent the outer periphery of the second emitter region 30 is substantially equidistant from that outer periphery, as is shown by the uniform dimension "d" in FIG. 2. The channel region 34 and the subregion 36 provide the resistor and diode functions, respectively, for the power transistor function, as described below in greater detail.

As is clearly shown in FIG. 2, the device 10 includes a plurality of conductive layers which further define the Darlington circuit function. More specifically, the device 10 includes a first conductive layer 38 on the upper surface 14 overlying a portion of the first emitter region 24 and that portion of the base region 22 which surrounds the outer periphery of the first emitter region 24. Thus, the first conductive layer 38 overlies and shorts the outer periphery of the first emitter-base PN junction 26.

A second conductive layer 40 on the upper surface 14 lies on the second emitter region 30, the subregion 36 and a portion of the channel region 34. The second conductive layer 40 includes a bonding area 41 directly over the subregion 36. A terminal lead 43 is shown bonded to the bonding area 41 in FIG. 4 only.

A third conductive layer 42 lies on the upper surface 14 on that portion of the base region 22 which surrounds the outer periphery of the second emitter region 30. Suitably, the inner periphery of the third conductive layer 42 includes fingers (not numbered) which lie on the interdigitated finger portions of the base region 22. Preferably, the first conductive layer 38 includes an extension 44 which overlies the tab 33 and that portion of the base region 22 surrounding the tab, the extension 44 being connected to the third conductive layer 42. A fourth conductive layer 46 on the upper surface 14 lies on the centrally located portion 28 of the base region 22. A fifth conductive layer 48 is disposed on the lower surface 16. The five conductive layers 38, 40, 42, 46 and 48 suitably comprise any one of a variety of high-lead content solders.

The device 10 can be fabricated by semiconductor manufacturing techniques well known in the art.

The device 10 of FIGS. 2–4 defines the Darlington circuit function of FIG. 1 in the following manner. The driving transistor 2 comprises the collector region 20, the base region 22 and the first emitter region 24. The power transistor 3 comprises the collector region 20, the base region 22 and the second emitter region 30. The first resistor 5 is defined between the fourth conductive layer 46 and the overlapping portion of the first conductive layer 38, and through the base region 22 underneath the first emitter region 24. The second resistor 6 is principally defined between the overlapping portions of the first and second conductive layers 38 and 40, and through the base region 22 and the channel region 34; thus, the value of the resistor 6 is determiend, in part, by the dimensions of the channel region 34. The diode 7 comprises the subregion 36 and the collector region 20. The three terminals 4, 8, and 9 are respectively defined by the fifth conductive layer 48, the fourth conductive layer 46 and the second conductive layer 40.

The device 10 has several advantages with respect to prior art integrated Darlington devices. For example, the device 10 employs a base-collector junction which only intersects the edge of the device (mesa junction), while achieving the desired resistor functions. Further, the resistor associated with the driver transistor is evenly distributed, thus enhancing uniformly distributed injection of the driver transistor.

In addition, the driving transistor is centrally located in the semiconductor body 12. Since the driving transistor operates at lower power densities, the thermal distribution of the device 10 is improved with respect to those integrated Darlington devices which employ the driver at the edge, and the power transistor in the center of the device.

An additional advantage accrues in the preferred embodiment of FIG. 2. By placing the diode (subregion 36) in the bonding area of the emitter of the power transistor, current injection is limited immediately underneath the bonding area, which insures more uniform injection throughout the entire emitter of the power transistor.

We claim:

1. A semiconductor device comprising:

a semiconductor body having upper and lower opposed surfaces and a side surface, a collector region of one type conductivity in said body adjacent to said lower surface, a base region of a type conductivity opposite to said one type conductivity in said body adjacent to said upper surface and forming a PN junction with said collector region, an annular first emitter region of said one type conductivity extending into said base region and completely surrounding a portion of said base region at said upper surface, another portion of said base region completely surrounding the outer periphery of said first emitter at said upper surface, a second emitter region of said one type conductivity extending into said another portion of said base region and being surrounded thereby at said upper surface, said second emitter region having an inner periphery substantially uniformly spaced from and surrounding a substantial portion of the outer periphery of said first emitter region, said another portion of said base region including an extension protruding into the second emitter region at said inner periphery thereof; and a first conductive layer on said upper surface overlying a portion of said first emitter region and a portion of the surrounding base region.

2. A semiconductor device as defined in claim 1 further comprising a second conductive layer on said upper surface overlying said base region extension and a portion of said second emitter region.

3. A semiconductor device as defined in claim 2 wherein the periphery of said base region extension within said second emitter region is substantially uniformly spaced from oppositely disposed portions of the outer periphery of said second emitter.

4. A semiconductor device as in claim 2 wherein said base region extension comprises a first area within said second emitter and a channel region connecting said first area to a portion of said base region outside said second emitter, said channel region having a width less than that of said first area.

5. A semiconductor device as defined in claim 4, wherein said second conductive layer overlies a portion of said channel region.

6. A semiconductor device as defined in claim 5, further comprising a third conductive layer on said upper surface overlying that portion of said base region surrounding the outer periphery of said second emitter region.

7. A semiconductor device as defined in claim 6, further comprising means for electrically connecting said first conducting layer to said third conductive layer.

8. A semiconductor device as defined in claim 7, wherein said connecting means comprises an extension of said first conductive layer connected to said third conductive layer, said extension overlying a portion of said base region where said second emitter region does not surround the outer periphery of said first emitter region.

9. A semiconductor device as defined in claim 8, further comprising:

said first emitter region having a tab extending into that portion of said base region where said second emitter region does not surround the outer periphery of said first emitter region; and wherein said extension of said first conductive layer overlies said tab.

* * * * *